United States Patent [19]

Jiang

[11] Patent Number: 4,613,959
[45] Date of Patent: Sep. 23, 1986

[54] ZERO POWER CMOS REDUNDANCY CIRCUIT

[75] Inventor: Ching-Lin Jiang, Dallas, Tex.

[73] Assignee: Thomson Components-Mostek Corportion, Carrollton, Tex.

[21] Appl. No.: 568,960

[22] Filed: Jan. 6, 1984

[51] Int. Cl.⁴ .......................... G11C 7/00; H01J 19/82; H03K 17/82; G06F 11/00
[52] U.S. Cl. .................................. 365/200; 365/227; 307/441; 307/219; 371/10
[58] Field of Search ...................... 307/202.1, 465, 441, 307/219, 451, 576, 579, 585; 365/95, 96, 200, 226, 227; 371/10

[56] References Cited
U.S. PATENT DOCUMENTS
4,346,459 8/1982 Sud et al. .................. 365/200

OTHER PUBLICATIONS
Sud et al., "Designing Static Rams for Yield as Well as Speed", Electronics, Jul. 28, 1981, pp. 121-126.

Primary Examiner—Terrell W. Fears
Assistant Examiner—Guy M. Miller
Attorney, Agent, or Firm—Roland Plottel

[57] ABSTRACT

A redundancy circuit that consumes no power before or after activation switches a pair of output nodes from a first set of complementary logic levels to an inverted set when it is activated by blowing a pair of fuses.

3 Claims, 3 Drawing Figures

ZERO POWER CMOS REDUNDANCY CIRCUIT

DESCRIPTION

TECHNICAL FIELD

The technical field of the invention is CMOS integrated circuits; particularly those including the feature of enabling redundant circuits in order to replace defective circuits.

BACKGROUND ART

The use of optional redundant subcircuits to replace defective circuits is well known in the integrated circuit art. One defect of prior art methods to disable the defective circuit and enable a replacement is that the enabling/disabling circuits of the prior art all consume electrical power in the on and/or off state. Since power savings is one of the main reasons for using the CMOS process, any DC power consumption that can be avoided should be.

DISCLOSURE OF INVENTION

The invention relates to an enabling/disabling circuit that consumes zero power in both the on and the off states. In a first state, the circuit maintains a pair of nodes at a logical one and a logical zero respectively to provide a pair of voltage levels that may be interpreted by other circuits. In a second state, the voltages on the pair of nodes assume the opposite value.

A feature of the invention is that the enabling process may be performed by a laser or by an electrical signal.

BEST MODE FOR CARRYING OUT THE INVENTION

The use of electrical or laser means to switch in redundant or repair circuits or to select among different options for a semicustom circuit is known in the art. It is done to provide the standard benefits of salvaging defective circuits or to provide one or more alternate configurations with a single set of masks and other setup costs. All schemes known in the prior art require DC power dissipation either before or after the switching operation. This feature is always undesirable and is especially undesirable for CMOS circuits for low power applications.

Figure 1:
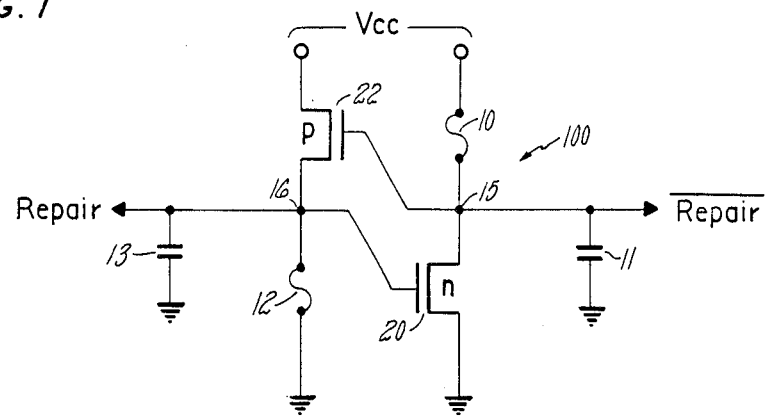
FIG. 1 illustrates a schematic diagram of the invention.

The circuit in FIG. 1 comprises two sets of a fuse connected in series with a transistor. On the left side, P-channel transistor 22 is connected from $V_{CC}$ to output node 16 and fuse 12, a conventional polysilicon fuse, is connected between node 16 and ground. On the right side, fuse 10 is connected in series between $V_{CC}$ and output node 15 and N-channel transistor 20 is connected between node 15 and ground. The gate of transistor 20 is connected to node 16 and the gate of transistor 22 is connected to node 15. The output states of node 16, referred to as REPAIR, and node 15, referred to as $\overline{\text{REPAIR}}$, are indicated in Table I. As is conventional, the states are complementary and assume the opposite logical value when the circuit is inactive. The stray capacitance associated with the output of node 16 is indicated by capacitor 13 and the stray capacitance of node 15 is indicated by capacitor 11. In the normal state, in which the circuit is considered inactive, the REPAIR line is a logical zero and the inverted $\overline{\text{REPAIR}}$ line is at the supply voltage. In that case, transistor 22 has its gate at the supply voltage and is turned off. Transistor 20 has its gate at zero volts and is also turned off, so that no DC power is dissipated.

In the inverted state, both fuses 10 and 12 are destroyed, either by the use of a laser or by the use of an electrical signal at high current, so that the electrical connection is broken. As used herein, the term "fuse" means any device that normally conducts current, but changes to an open circuit in response to some stimulus such as an excess current or a laser beam. Fuse-blowing by high current is well-known and the application of the term "fuse" to include a device that is destroyed by a laser light beam instead of electricity is known in the art. The particular fuse material is conventional and is not part of the invention.

When the circuit is turned on, after the fuses are blown, mode 15 will remain at ground, connected through transistor 20. Transistor 22 will be turned on as the supply voltage rises, thus permitting node 16 and the gate of transistor 20 to be essentially at the supply voltage. Transistor 20 is therefore turned on, providing a low impedance path to ground that maintains node 15 at essentially zero volts. Both transistors 20 and 22 are thus turned on and latched in a stable configuration that does not consume any DC power. The voltages on output nodes 15 and 16 will be able to turn on or turn off gates of other transistors in the circuit to perform the enabling or disabling function.

Figure 2:
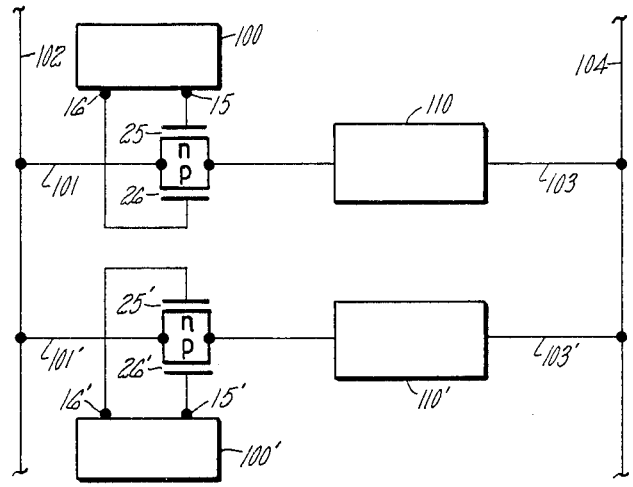
FIG. 2 illustrates the application of the invention in a larger circuit.

FIG. 2 illustrates a highly simplified form of the application of circuit 100 of FIG. 1. The simplification is done to present the principle of application most clearly. Input line 101, connected to bus 102, carries signals that are normally meant to be processed by circuit 110, the output of which passes along line 103 to output bus 104. Buses 102 and 104 may be a single line or any number of lines and input and output lines 101 and 103 may have a corresponding number of lines to mate with the buses. The input signals from bus 102 pass through pass transistors 25 and 26 in a conventional CMOS pair of N and P pass transistors. Pass transistors 25 and 26 are controlled by circuit 100 with output node 16 being connected to the gate of P-channel pass transistor 26 and node 15 being connected to the gate of N-channel pass transistor 25. In normal operation, both transistors 25 and 26 will be turned on and the signals will pass through unimpeded.

For purposes of illustration, it will be assumed that circuit 110 is defective and is to be replaced by circuit 110'. In that case, a conventional laser system that is not part of the invention destroys fuses 10 and 12 of circuit 100 and corresponding fuses 10' and 12' of circuit 100'. Both circuits 100 and 100' switch from the normal state to the opposite state, so that pass transistors 25 and 26 are disabled and pass transistors 25' and 26' are enabled.

In applying this invention to specific embodiments, care should be taken to size transistors 20 and 22 such that the resistance in the on state is greater than the resitance of the fuse to which it is paired. It is also important, in order to have the circuit in the correct state when power is turned on, that the magnitude of capacitors 11 and 13, representing the stray node capacitance be large enough to suppress transients during the power-up process (or any other transients). Additional capacitors may be added to the circuit to provide sufficient capacitance for reliability.

Figure 3:
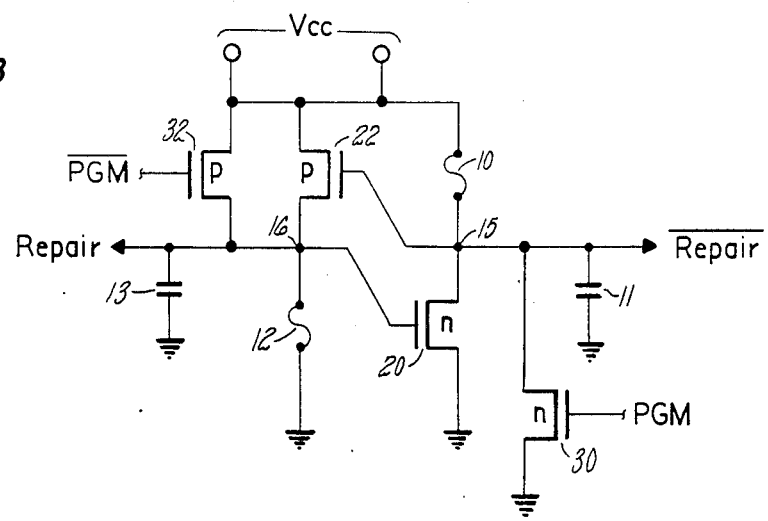
FIG. 3 illustrates an alternative embodiment of the invention.

Referring now to FIG. 3, an alternate embodiment that blows fuses 10 and 12 electrically is shown. The circuit of FIG. 1 has been modified by the addition of two high-current transistors, P-type transistor 32 and N-type transistor 30, controlled by a set of complementary signals PGM and $\overline{PGM}$. Transistor 32 is normally off, of course, and is turned on to establish a low impedance path from $V_{CC}$ to ground through fuse 12. The high current capacity of transistor 32 is chosen to be much greater than the current required to blow fuse 12. N-type transistor 30 acts to blow fuse 10 in an analogous fashion, by opening a path to ground through fuse 10. The fuse-blowing current may be between any two terminals of a power source, not necessarily between the power supply and ground.

Typical values are an impedance for the transistors in the on state of less than ten ohms and an impedance of about 100 ohms for the fuses.

The PGM and $\overline{PGM}$ signals may be generated on-chip by conventional address-decoding circuitry responsive to an address for the circuit to be enabled or disabled as the case may be. A straightforward implementation for a memory would be to have the decoding circuits directly connected to the address pins and enabled by a signal on a dedicated pin or by an address within a certain reserved range. The address presented to the pins during the signal-enable period would point to the circuit 100 that was to have its state switched from enable to disable or vice versa. An alternative implementation would be to have PGM and $\overline{PGM}$ pads for each circuit 100 within the body of the chip and to apply voltage directly to the pads during the probe test sequence, so that a probe would be placed on the appropriate pad to disable a defective circuit, then to enable a replacement.

The invention is not limited to these two applications, of course, and those skilled in the art will readily be able to apply it for other purposes, such as storing data, whenever a permanent, selected DC signal is desired.

TABLE I

|  | Repair | Repair |
|---|---|---|
| Inactive | 0 | $V_{CC}$ |
| Active | $V_{CC}$ | 0 |

I claim:

1. In a CMOS semiconductor integrated circuit, a substantially zero-power consumption enabling/disabling circuit for switching at least one output node from a first voltage level to a second voltage level, comprising:

a first P-type transistor the channel terminals of which are connected between a power supply node and a first output node, and a first fuse connected between said first output node and a ground;

a first N-type transistor the channel terminals of which are connected between said ground and a second output node, and a second fuse connected between said second output node and said power supply node;

wherein said first P-type transistor has a first P-type gate electrode and means connecting said first P-type gate electrode to said second output node, so that said first P-type transistor is gated off by said power supply only when said second fuse is conductive; and said first N-type transistor has a first N-type gate electrode and means connecting said first N-type gate electrode to said first output node, so that said first N-type transistor is gated off by said ground only when said first fuse is conductive;

both of said first P-type and said first N-type transistors drawing no load current as long as both of said first and said second fuses are conductive, wherein said first output node is maintained substantially at ground potential and said second output node is substantially at power supply potential; and said first P-type transistor maintaining said first output node substantially at said power supply potential and said first N-type transistor maintaining said second output node substantially at said ground potential when both of said first and said second fuses are non-conductive.

2. A circuit according to claim 1, further including means for destroying said first and said second fuses electrically by establishing low-impedance paths through said first and said second fuses with a voltage difference between the ends of said paths.

3. A circuit according to claim 2, including a second P-type transistor the channel terminals of which are connected between said power supply node and said first output node in parallel with said first P-type transistor, said second P-type transistor having a gate electrode connected to be controlled by a first predetermined signal to blow said first fuse by establishing a first low-impedance path between said power supply node and said ground, which first path includes said first fuse; and a second N-type transistor the channel terminals of which are connected between said second output node and said ground in parallel with said first N-type transistor, said second N-type transistor having a gate electrode connected to be controlled by a second predetermined signal to blow said second fuse by establishing a second low-impedance path between said power supply node and said ground, which second path includes said second fuse.

* * * * *